United States Patent
Chominski

(10) Patent No.: US 6,946,924 B2
(45) Date of Patent: Sep. 20, 2005

(54) LOW NOISE VOLTAGE CONTROLLED OSCILLATOR

(75) Inventor: Paul P. Chominski, San Diego, CA (US)

(73) Assignee: International Business Machines Corporation, Armonk, NY (US)

(*) Notice: Subject to any disclaimer, the term of this patent is extended or adjusted under 35 U.S.C. 154(b) by 56 days.

(21) Appl. No.: 10/219,084

(22) Filed: Aug. 14, 2002

(65) Prior Publication Data

US 2004/0032302 A1 Feb. 19, 2004

(51) Int. Cl.$^7$ .................................................. H03B 5/12
(52) U.S. Cl. ................................. 331/177 V; 331/117 R
(58) Field of Search ........................... 331/177 V, 167, 331/169, 181, 108 C, 108 D, 107 P, 117 D, 117 FE, 117 R

(56) References Cited

U.S. PATENT DOCUMENTS

| | | | | |
|---|---|---|---|---|
| 3,567,920 A | * | 3/1971 | Campbell | 246/249 |
| 3,571,754 A | * | 3/1971 | Healey et al. | 331/116 R |
| 3,622,914 A | * | 11/1971 | Chung | 332/175 |
| 4,156,210 A | * | 5/1979 | Lipke | 331/114 |
| 4,336,505 A | | 6/1982 | Meyer | 331/1 R |
| 4,360,790 A | * | 11/1982 | Heise | 331/114 |
| 4,381,487 A | * | 4/1983 | Erickson | 330/306 |
| 4,550,293 A | * | 10/1985 | Driscoll | 331/116 R |
| 5,351,014 A | | 9/1994 | Ichiyoshi | 331/1 A |
| 5,486,796 A | * | 1/1996 | Ishikawa et al. | 331/117 R |
| 5,532,651 A | * | 7/1996 | Jager et al. | 331/96 |
| 5,561,398 A | * | 10/1996 | Rasmussen | 331/36 C |
| 5,715,528 A | * | 2/1998 | Kuo et al. | 455/142 |
| 5,734,299 A | | 3/1998 | Brown | 330/254 |
| 5,955,929 A | | 9/1999 | Moon et al. | 331/57 |
| 5,963,101 A | | 10/1999 | Iravani | 331/57 |
| 5,973,575 A | | 10/1999 | Kamogowa et al. | 331/117 R |
| 5,994,968 A | | 11/1999 | Iravani et al. | 331/57 |
| 6,016,082 A | | 1/2000 | Cruz et al. | 331/117 FE |
| 6,025,765 A | | 2/2000 | Brown | 333/215 |
| 6,107,893 A | | 8/2000 | Forbes | 331/132 |
| 6,181,216 B1 | | 1/2001 | Waight | 331/117 FE |
| 6,188,287 B1 | | 2/2001 | Avanic et al. | 331/11 |
| 6,194,972 B1 | | 2/2001 | Brown | 331/108 B |
| 6,204,734 B1 | * | 3/2001 | Zhang et al. | 331/117 R |
| 6,274,937 B1 | | 8/2001 | Ahn et al. | 257/777 |
| 6,311,050 B1 | | 10/2001 | Welland et al. | 455/260 |
| 6,639,490 B2 | | 10/2003 | Chominski | 333/119 |
| 2002/0164965 A1 | | 11/2002 | Chominski et al. | 455/118 |
| 2003/0006839 A1 | | 1/2003 | Chominski | 330/140 |
| 2003/0045248 A1 | | 3/2003 | Chominski | 455/127 |
| 2003/0080827 A1 | | 5/2003 | Suzuki et al. | |
| 2003/0081435 A1 | | 5/2003 | Chominski | 363/61 |
| 2004/0032302 A1 | | 2/2004 | Chominski | 331/100 |
| 2004/0066252 A1 | | 4/2004 | Chominski | 333/118 |

OTHER PUBLICATIONS

Abidi, *Analog Circuit Design–RF Analog-to-Digital Converters: Sensor and Actuator Interfaces; Low–Noise Oscillators, PLLs and Synthesizers*, chapter entitled "How Phase Noise Appears in Oscillators", published by Kluwer Academic Publishers, Boston, Nov. 1977, ISBN 0-7923-9968-4.

Ham and Hajimiri, "Concepts and Methods in Optimization of Integrated LC VCOs", *IEEE Journal of Solid–State Circuits*, vol. 36, No. 6, Jun. 2001, pp. 896–909.

* cited by examiner

*Primary Examiner*—Timothy P. Callahan
*Assistant Examiner*—An T. Luu
(74) *Attorney, Agent, or Firm*—Joseph P. Abate

(57) ABSTRACT

A voltage controlled oscillator, comprising a pair of transistors connected to a tank circuit, said tank circuit including a plurality of tuning diodes connected in parallel with an inductor, said tuning diodes having cathodes connected to a common connection.

7 Claims, 4 Drawing Sheets

For f = 2 GHz
Rb1 = Rb2 = 2 to 15 kohm
Re1 = Re2 = 0 to 20 ohm
Cb1 = Cb2 = 0.5 to 5 pF
Cout1 = Cout2 = 0.05 to 1 pF
Cd1 = Cd2 (varactor diode capacitance - max) = 3 to 7 pF
L (mains resonator) = 0.5 to 2 nH
Lc = 0 to 15 nH
Rc = 0 to 10 kohm
Cc = 5 to 50 pF
Cvcc = 10 to 50 pF
Vcc = 2 to 5V
Vtune = 0.2 to 5V
Vbias = 0.65V to 0.8V

FIG. 5

LOW NOISE VOLTAGE CONTROLLED OSCILLATOR

BACKGROUND OF THE INVENTION

1. Field of the Invention

The present invention relates to voltage controlled oscillators (VCOs) and, particularly, to such oscillators implemented on integrated circuits (ICs).

2. Description of the Prior Art

VCOs implemented on ICS are known. See, for example, U.S. Pat. No. 5,973,575, "Fully Monolithic Voltage Controlled Oscillator with Wide Tuning Range," Kamogawa et al, filed Feb. 12, 1998, issued Oct. 26, 1999, which is incorporated in its entirety herein by reference.

IC-implemented voltage controlled oscillators often experience undesirable noise (e.g., phase noise) from sources, among others, such as the supply voltage or source of potential $V_{cc}$. See, for example, the chapter entitled "How Phase Noise Appears in Oscillators" of the book *Analog Circuit Design-RF Analog-to-Digital Converters; Sensor and Actuator Interfaces; Low-Noise Oscillators; PLLs and Synthesizers*, published by Kluwer Academic Publishers, Boston, November 1977, ISBN 0-7923-9968-4; and also "Concepts and Methods in Optimization of Integrated LC VCOs", *IEEE Journal of Solid-State Circuits*, Vol. 36, No. 6, June 2001, pgs. 896–909, by Ham and Hajimiri. The sources of phase noise in a VCO need not be further discussed.

SUMMARY OF THE INVENTION

The present inventor believes that further improvements for immunizing VCOs from power supply noise are achievable.

It is a principal object of the present invention to increase the immunity of a VCO from power supply noise.

According to the present invention, a voltage controlled oscillator includes a pair of transistors connected to a resonator or tank circuit. The tank circuit includes a plurality (e.g., pair) of voltage-variable capacitors such as varactors or tuning diodes. The voltage-variable capacitors are in a parallel connection with an inductor. In one embodiment, the inductor is an autotransformer. According to the invention, the voltage-variable capacitors have anodes connected to a common point for connection to a voltage source. The voltage source is, e.g., a variable voltage source for tuning the oscillator.

Further and still other objects of the present invention will become more readily apparent when the following detailed description is taken in conjunction with the following drawings.

BRIEF DESCRIPTION OF THE DRAWINGS

FIG. 5 is a list of non-limiting exemplary ranges for parameter values of the circuit elements shown in FIG. 1.

DETAILED DESCRIPTION OF PREFERRED EMBODIMENT AND BEST MODE

Figure 1:
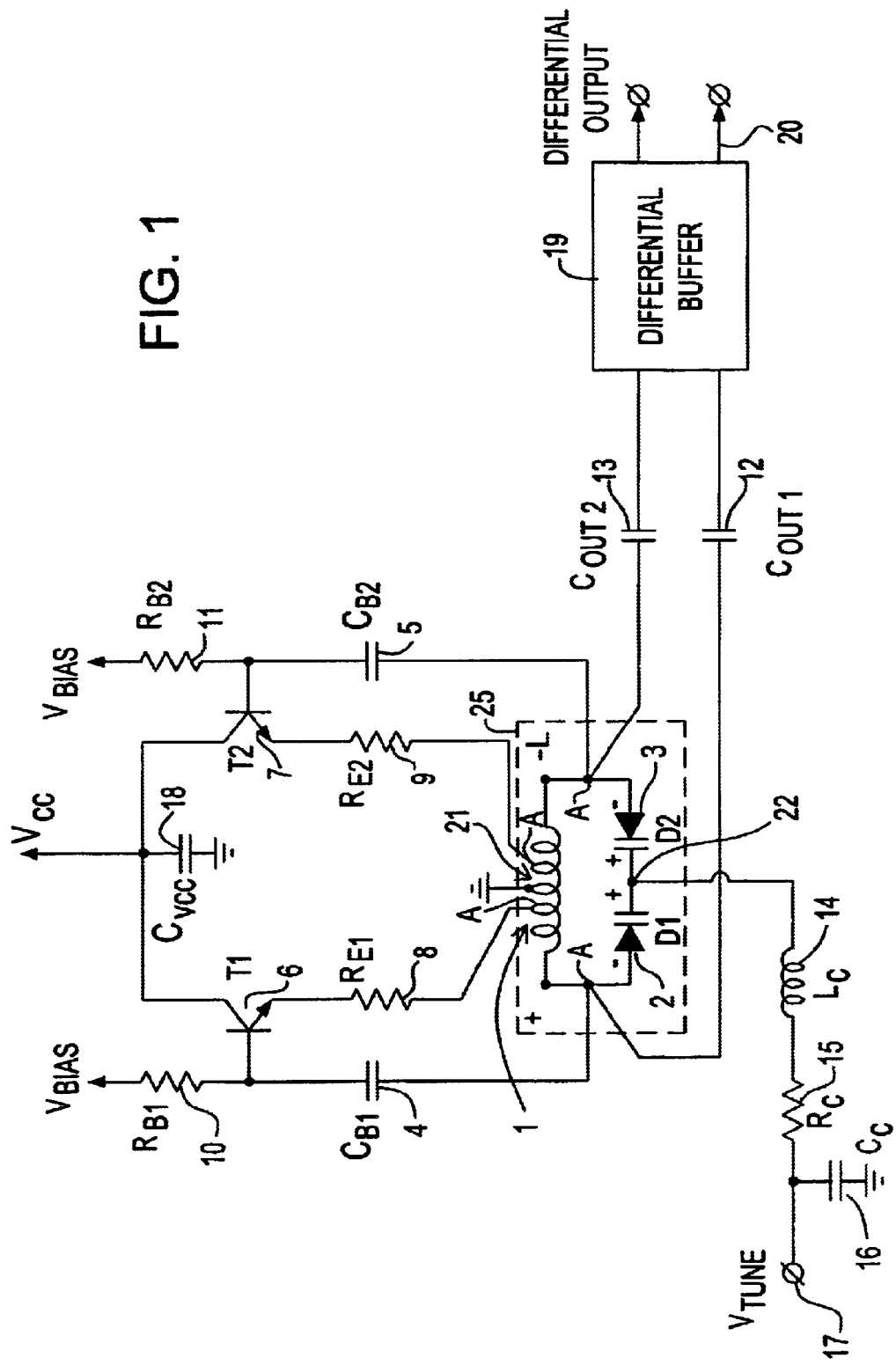
FIG. 1 is a schematic circuit diagram of a first preferred embodiment of the invention.

Referring now to the figures, and FIG. 1 in particular, there is shown a first preferred embodiment of a VCO according to the invention having a first preferred tank circuit 25 connected to a pair of transistors 6, 7 as shown. In the circuit 25, +, − indicate biasing conditions when $V_{tune}$, $V_{bias}$, $V_{cc}$ are applied to the VCO. For example, with $V_{tune}$ (positive control voltage) at a positive voltage, the point 22 is at a positive potential such that varactors 2, 3 are reversed-biased, i.e, have positive terminals +.

In FIG. 1, oscillations begin with noise amplified in the amplifier. In this case, amplifier is a differential circuit including bipolar junction transistors 6, 7. In oscillation start-up conditions, thermal noise generated in the transistors is injected into tabs or taps A of the main resonator coil 1 of resonator or tank circuit 25. This coil works like an autotransformer increasing voltage at its edges. Higher voltage from the coil is fed back to the bases of the transistors 6, 7 through coupling capacitors 4, 5. Transistors are again amplifying power of this signal and transforming to a low impedance. This higher power signal from the emitters of the transistors 6, 7 is again injected through resistors 8, 9 to the taps of the resonator coil 1.

After a few such cycles, circuit will oscillate at the resonance frequency of the resonator circuit 25, which frequency is determined by inductance L 1 and capacitance of the series connected tuning diodes 2, 3 and additional capacitance loading the resonator. This additional capacitance is a sum of input capacitance of the transistors 6, 7 connected through the series capacitors 4, 5, and additional loading capacitance of the optional differential buffer 19 connected to the resonator or tank circuit 25 through optional output coupling capacitors 12, 13. Signal from the resonator circuit 1,2,3 is connected through the output coupling capacitors 12, 13 to the buffer 19 in order to provide isolation between resonator or tank circuit 25 and output of the oscillator 20. Buffer 19 is, for example, a conventional buffer.

The frequency of the oscillations is a function of the capacitance connected in parallel to the resonator inductance 1. This capacitance will be varied by means of capacitance diodes 2, 3 controlled by a tuning voltage 17. For higher values of the tuning voltage 17, capacitance of the diodes 2, 3 will be lower, resulting in an increase of the frequency of oscillations.

Tuning diodes 2, 3 are connected in series and opposite directions. Tuning voltage 17 is connected to a common connection point 22 of the diodes through the series inductor 14 and resistor 15. At the tuning voltage input, it is desirable to use an additional bypass capacitor 16 attenuating noise and RF signals possibly present on this input entering the circuit. This capacitor 16 will also attenuate RF signal leaking from the resonator or circuit 25 and consequently will increase RF isolation to and from the resonator circuit 25.

Resonator inductor 1 has a middle tap 21 connected to a ground. Because of the symmetry of the circuit, at the connection point 22 of the tuning diodes 2, 3, there is no, or very little, RF signal. This common point could alternatively be grounded, but due to the not perfect balance of the circuit and the non-linearities of the tuning diodes, it is desirable to isolate this point 22 using series inductor 14 and resistor 15. Value of this resistor should not be too high in order to avoid contribution of the thermal noise voltage generated in this resistor and modulating the oscillator through the tuning diodes. This thermal noise voltage will increase an FM component of the phase noise of the oscillator.

The transistors 6, 7 are biased through base bias resistors 10, 11. Bias voltage source $V_{bias}$ is such that it provides a noise free and temperature compensated current through the transistors, and is conventional.

Resistors in series with the emitters 8, 9 are providing negative feedback, which will lower phase noise of the oscillator in low frequency offsets from the carrier.

Collectors of the transistors are connected together and connected to the supply voltage $V_{cc}$ through the RF and noise suppressing bypass capacitor 18 which is connected to ground potential.

In FIG. 1, emitters of the transistors T1, T2 are connected to the tabs of the resonator L through series resistors RE1 and RE2. RE1 and RE2 have low values or can even be omitted. Purpose of those resistors is to provide negative feedback lowering value of the phase noise close to the carrier frequency. This configuration is possible in integrated circuits where proper bias voltage to the bases of the transistors can be provided. PTAT bias will provide stable bias in temperature, but BandGap bias can be more desirable for high frequency applications because it will "estabilize" the fT of the transistors.

For other applications than a VCO on an IC, different bias techniques can be provided in order to maintain DC balance and temperature stability.

In FIG. 1, $$f\_osc := \frac{1}{2\pi \cdot \sqrt{L \cdot Cb1 \cdot \frac{[Ccb + Cce \cdot (1 - Kv)]}{Cb1 + Ccb + Cce \cdot (1 - Kv)}}}$$

where:

$C_{bf}$—coupling capacitor between inductor and base of the transistor $C_{cb}$—collector-base capacitance $C_{ce}$—emitter-base capacitance Kv—voltage gain of the emitter follower, KV<1.

Figures 2, 3:
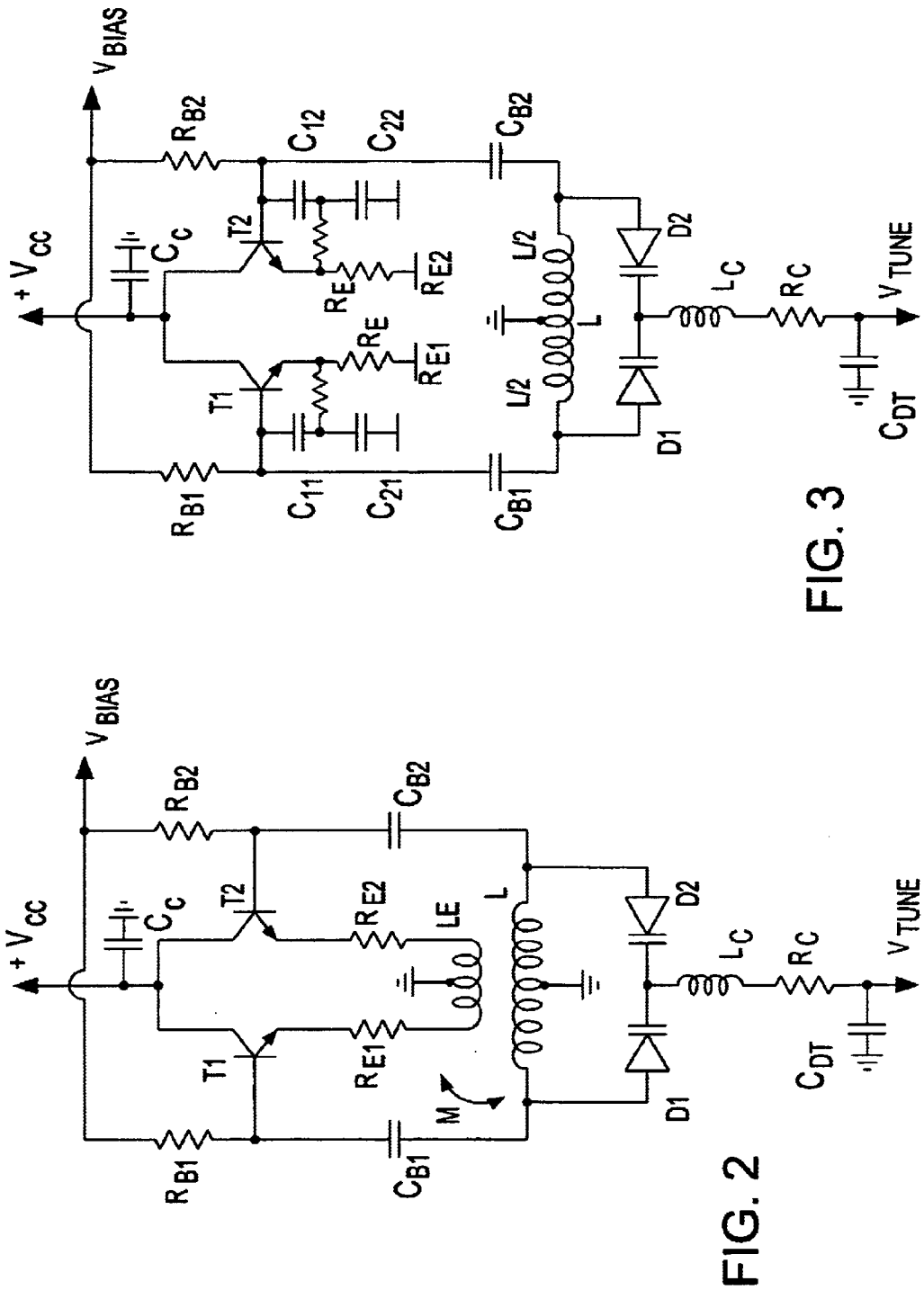
FIG. 2 is a schematic circuit diagram of a second preferred embodiment of the invention.
FIG. 3 is a schematic circuit diagram of a third preferred embodiment of the invention.

FIG. 2 shows a second preferred embodiment of the invention. FIG. 2 shows a VCO with a magnetic coupled resonator L, LE. This configuration is similar to the first one, but the feedback is provided by means of a transformer including two inductors L and LE with a mutual coupling factor M. This configuration might be more desirable in some IC layouts or configurations.

FIG. 3 shows a third preferred embodiment. In FIG. 3, a VCO with feedback through a capacitive voltage divider is shown. In this configuration, feedback to the transistors T1, T2 is provided through the capacitive voltage divider C1, C2. Similar to the first circuit (FIG. 1), emitter series resistor RE will provide negative feedback lowering close in carrier frequency phase noise. RE1 can be substituted by inductors or current sources.

Figure 4:
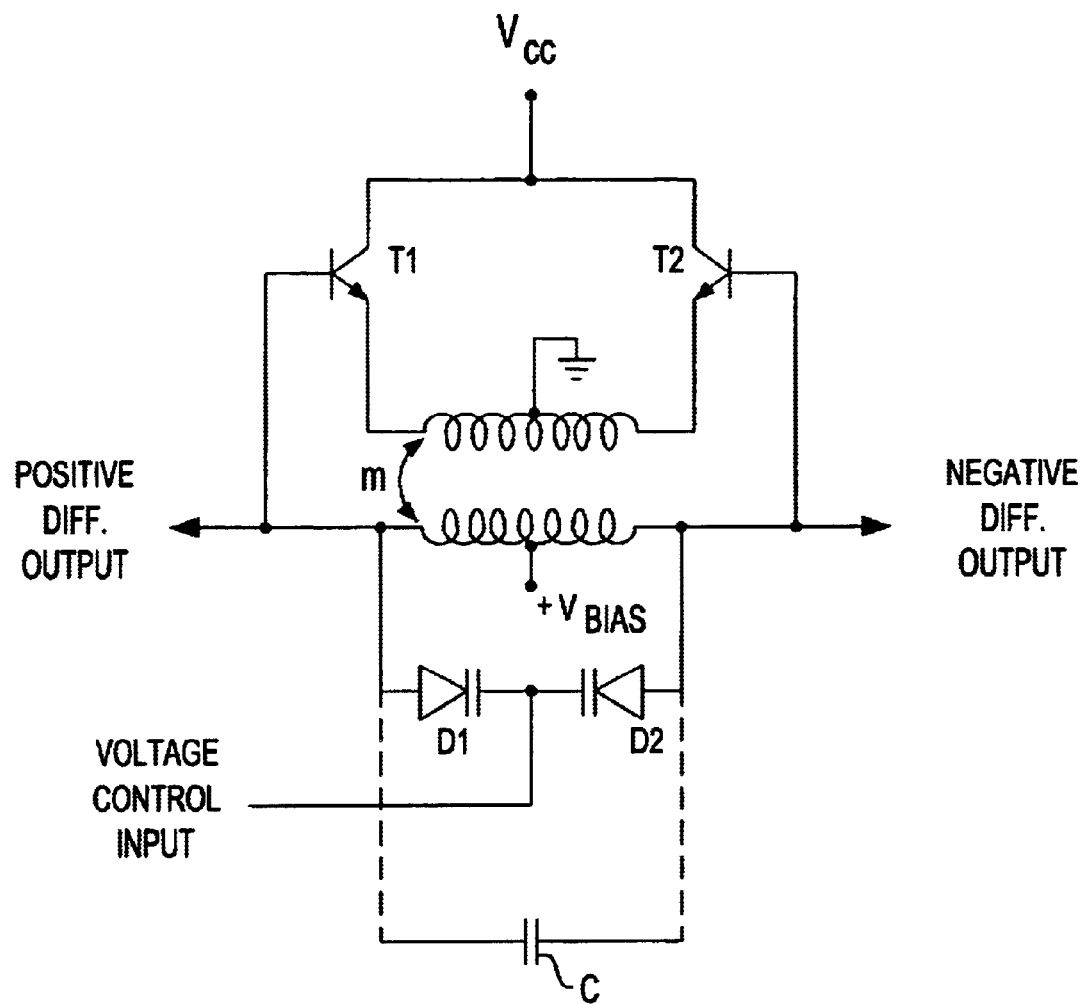
FIG. 4 is a schematic circuit diagram of a more simplified embodiment of the inventive circuit shown in FIG. 2.

FIG. 4 is a simplified or modified version of the embodiment shown in FIG. 2, according to the present invention. Optionally, a fixed capacitor C is connected in parallel with the tank circuit, to improve the frequency range of the VCO. The transformer is connected to a source of potential $V_{bias}$, so as to eliminate a necessity for capacitors CB1, CB2 of FIG. 2.

Finally, FIG. 5 is a table listing preferred ranges of values for circuit elements shown, e.g., in FIG. 1.

In the preferred embodiments, the inventor believes that the balanced architecture of the inventive oscillator including, without limitation, the emitter coupled pair of transistors and the symmetrical tank circuit having varactors connected to a common point for connection to a tuning voltage all help to lower phase noise which may be introduced from the power supply $V_{cc}$ into the VCO. Preferably, the inductive element of the tank circuit has a central connection connected to a ground potential. The inventive VCO exhibits a high common mode rejection ratio which suppresses noise from the voltage supply line.

Preferably, resonator L is symmetrical with the center tab grounded. Two tuning varactor diodes D1 and D2 are connected in parallel to the resonator in such a configuration that anodes will be connected to the resonator "hot" edges and cathodes will be connected together. This common cathode point will not have significant RF voltage and is connected to the control voltage (tuning voltage) through, e.g., relatively low value resistor RC and/or inductor LC used as choke. Care should be taken to avoid pickup of RF or interfering field by this choke. Capacitor filtering tuning voltage $V_{tune}$ can be a part of a PLL loop filter. Tuning voltage is then connected between ground and varactor inputs to help eliminate noise from the supply voltage rail(s).

While there has been shown and described preferred embodiments of the present invention, it will be apparent to those skilled in the art that various changes and modifications may be made therein without departing from the spirit and scope of the present invention which shall be limited by only the appended claims. For example, transistors other than bipolar transistors can be used, such as FETs.

What is claimed is:

1. A voltage controlled oscillator circuit, comprising:
   an autotransformer having a positive terminal, a negative terminal, center tap terminal, a positive input terminal, and a negative input terminal, where the positive input terminal is located between the positive terminal and the center tap terminal, and the negative input terminal is located between the center tap terminal an the negative terminal;
   a first voltage controlled variable capacitor having a positive terminal connected to an input and a negative terminal connected to a positive terminal of the autotransformer;
   a second voltage controlled variable capacitor having a positive terminal connected to the input and a negative terminal connected to the negative terminal of the autotransformer;
   a first transistor having a collector;
   a second transistor having a collector;
   a first emitter resistor connected between the emitter of the first transistor and the positive input terminal of the autotransformer;
   a second emitter resistor connected between the emitter of the second transistor transistor and the negative input terminal of the autotransformer;
   a first coupling capacitor connected between the positive terminal of the autotransformer and the base of the first transistor;
   a second coupling capacitor connected between the negative terminal of the autotransformer and the base of the second transistor;
   a first base bias resistor connected between the base of the first transistor and the voltage bias input; and
   a second base bias resistor connected between the base of the second transistor and the voltage bias input.

2. The circuit as claimed in claim 1, wherein said first emitter resistor has a resistance in a range of 0 ohms to 20 ohms.

3. The circuit as claimed in claim 1, wherein said second emitter resistor has a resistance in a range of 0 ohms to 20 ohms.

4. The circuit as claimed in claim 1, wherein said first coupling capacitor has a capacitance in a range of 0.5 pF to 5 pF.

5. The circuit as claimed in claim 1, wherein said first second coupling capacitor has a capacitance in a range of 0.5 pF to 5 pF.

6. A low noise differential output voltage controled (VCO) oscillator circuit, comprising:

a transformer having a center tapped primary and a center tapped secondary where the primary center tap is connected to ground and the secondary center tap is connected to a positive voltage bias input, and further providing a positive differential output signal from the positive terminal of the transformer secondary and negative differential output signs from the negative terminal of the transformer secondary;

a first transistor having a collector connected to a voltage supply and having an emitter connected to the positive terminal of the transformer primary and having a base connected to the positive terminal of the transformer secondary;

a second transistor having a collector connected to the voltage supply and having an emitter connected to the negative terminal of the transformer primary and having a base connected to the negative terminal of the transformer secondary;

a first voltage variable capacitor having a positive side connected a voltage control input and having a negative side connected to the positive terminal of the transformer secondary;

a second voltage variable capacitor having a positive side connected to the voltage control input and having a negative side connected to the negative terminal of the transformer secondary.

7. The circuit as claimed in claim 6, further comprising:

a fixed capacitor connected from the positive terminal of the transformer secondary to the negative terminal of the transformer secondary.

* * * * *